United States Patent [19]

Staley et al.

[11] Patent Number: 4,748,640

[45] Date of Patent: May 31, 1988

[54] DIGITAL CIRCUIT WITH BAND LIMITING CHARACTERISTICS FOR MODEM

[75] Inventors: Peter Staley, Kings Park, N.Y.; David Coyne, Glenrothes, Scotland

[73] Assignee: General Instrument Corp., New York, N.Y.

[21] Appl. No.: 831,565

[22] Filed: Feb. 21, 1986
(Under 37 CFR 1.47)

[51] Int. Cl.⁴ .................. H03B 28/00; H03K 7/06; H04L 27/10

[52] U.S. Cl. .................. 375/65; 375/42; 375/45; 328/14; 328/27; 332/16 R

[58] Field of Search ........... 375/42, 45, 62, 65; 328/14, 15, 27; 332/9 R, 9 T, 16, 16 T; 370/110.2; 364/721

[56] References Cited

U.S. PATENT DOCUMENTS

| | | | |
|---|---|---|---|
| 3,641,566 | 2/1972 | Konrad et al. | 328/27 |
| 3,657,657 | 4/1972 | Jefferson | 328/27 |
| 3,792,378 | 2/1974 | Hughes et al. | 332/16 R |
| 3,997,855 | 12/1976 | Nash | 375/62 |
| 4,484,296 | 11/1984 | Treise et al. | 328/14 |
| 4,596,022 | 6/1986 | Stoner | 375/62 |
| 4,656,428 | 4/1987 | Isikawa | 328/14 |

*Primary Examiner*—Robert L. Griffin
*Assistant Examiner*—Andrew J. Telesz, Jr.
*Attorney, Agent, or Firm*—James & Franklin

[57] ABSTRACT

The input digital signal is applied to a transition detector which causes an up/down counter to increment or decrement each time a transition is detected. The output of the counter is utilized to address a read only memory (ROM) which, in turn, generates binary words representing first and second integers. These binary words are used to control a programmable divider to generate an output having a frequency which moves between two values corresponding to the digital input. The rate at which the frequency changes between the two values is controlled by the ROM contents. In the implementation, the frequency changes with a raised cosine shape.

10 Claims, 9 Drawing Sheets

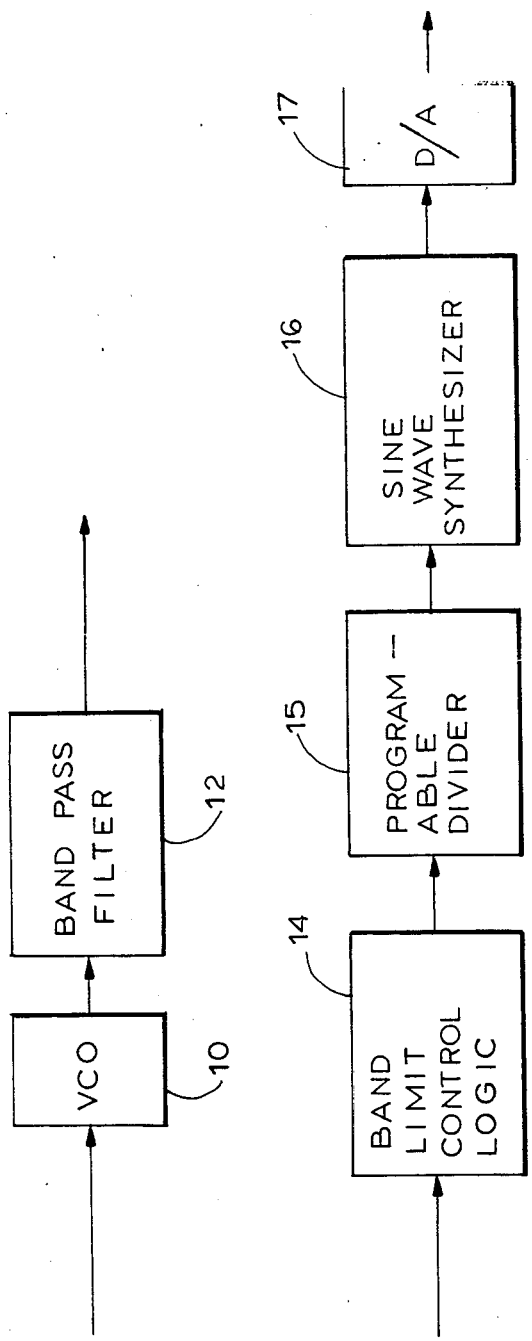
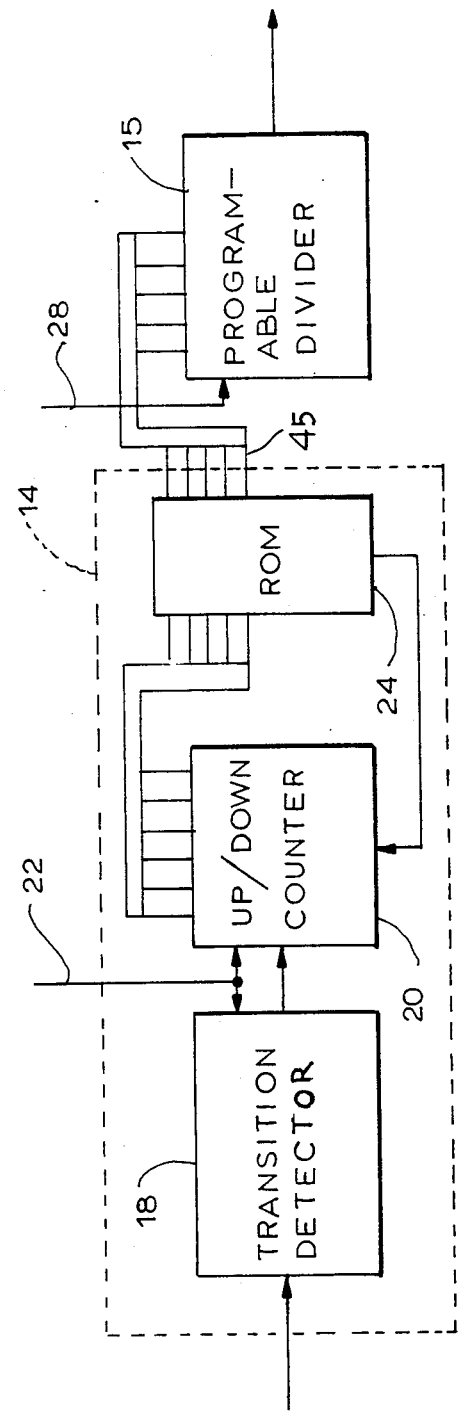
FIG. 1 PRIOR ART
FIG. 2
FIG. 3

DIGITAL CIRCUIT WITH BAND LIMITING CHARACTERISTICS FOR MODEM

The present invention relates to digital filtering or limiting apparatus and, more particularly, to apparatus for digital filtering or limiting the output spectra of the transmit side of a modem.

A modem is an electronic device which permits digital equipment, such as computers, to communicate over standard telephone lines. The modem serves to translate the digital signals used by computers and the like into analog signals which can be transmitted through the telephone lines. Each modem has a receiving section and a transmitting section and may operate such that each digital system transmits and receives data simultaneously.

The telephone system is designed to transmit frequencies in the relatively limited range corresponding to the human voice. Frequencies outside of this range cannot be effectively transmitted. The inherent characteristics of a telephone system cause attenuation or distortion of frequencies outside of this range. Signals of the type employed by digital equipment are outside of the operating range of the telephone system. Accordingly, for digital equipment to communicate over the telephone lines it is necessary that modems be used to convert the digital signals into analog waveforms which can be transmitted through the telephone lines.

The transmitting section of the modem functions to encode a digital signal into an analog signal comprising a pair of frequencies, representing "0s" and "1s" respectively, within the appropriate frequency range for transmission to the telephone system. In the receiving section, the analog signals consisting of two frequencies within the operating range of the telephone system are decoded back into a digital signal in which pulses represent one of the received frequencies and the absence of pulses represent the other of the received frequencies.

In order for the modem to receive and transmit signals simultaneously, it must be able to distinguish between the received and transmitted signals. The received and transmitted signals are each developed by frequency modulating a carrier between two frequencies which are approximately 200 Hz apart. The telephone company sets certain standards relating to the frequency which can be used over the telephone lines. In particular, two carrier bands each including a pair of frequencies, are available for modem communication. The first pair of frequencies are 1070 kHz and 1270 kHz, and the second pair are 2025 kHz and 2225 kHz. These frequencies are for the Bell 103 standard. The present invention is designed for use in a modem which is applicable to all FSK standards. Moreover, the present invention can be utilized in PSK, DPSK, and QAM modems as well.

Either carrier band can be used to transmit or to receive. Normally, the modem originating the communication will choose a transmit carrier band. The modem receiving the communication will detect the transmit carrier band and automatically adapt for receiving the first carrier band and transmitting the second carrier band.

In order for the modem to distinguish between the transmit carrier band and the receive carrier band, the transmit spectra must be confined so as not to overlap the received band. This operation is conventionally performed through the use of a band pass filter on the output of the transmit section of the modem. Filters of this type, however, create problems for integrated circuit manufacturers because of the difficulty of integrating such filters on a chip.

More specifically, there is no easy way of fabricating close tolerance resistors and capacitors on chips and thus obtaining the necessary stability of the parameters of the filter. Certain techniques have been attempted to overcome this problem. For example, controllable resistors or capacitors, in the form of MOS transistors or the like, have been utilized. However, this technique results in problems of signal size and harmonic distortion which is produced by the voltage controlled components. Another approach to this problem is the switched capacitor filter technique wherein all resistors are replaced by switched capacitors. However, this technique may result in certain problems which contraindicate its use.

In its most general form, the present invention relates to apparatus for generating wave forms from digital signals but is particularly useful for band limiting FSK (frequency shift keyed) or PSK (phase shift keyed) signals, in the transmission section of a modem. More specifically, the invention may be employed to band limit the transmitted signals in a modem in a manner which eliminates the necessity for the use of a band limiting filter and thus permits the modem to utilize digital processing techniques. Thus, the present invention can be combined with a digital equivalent of a voltage controlled oscillator to form the transmission section of a modem.

For such an application, the present invention permits the transmission section of the modem to be implemented digitally and, at the same time, produces the necessary band limiting of the transmitted signals to permit same to be easily distinguished.

However, it should be appreciated that the present invention can be utilized for other applications wherein different types of waveforms are generated. For this reason, although the invention is described as it would be used in a modem, this use should not be construed as a limitation on the present invention.

It is, therefore, a prime object of the present invention to provide a digital circuit with band limiting characteristics which can be implemented using standard integrated circuit fabrication techniques.

It is another object of the present invention to provide a digital circuit with band limiting characteristics which can be utilized for band limiting of FSK, QAM, or PSK signals.

It is another object of the present invention to provide a digital circuit with band limiting characteristics which, when combined with the digital equivalent of a voltage controlled oscillator and sinewave synthesizer can function as the transmission section of a modem.

In accordance with the present invention, a digital circuit is provided for generating an output signal whose frequency is a function of a digital input signal The circuit comprises a means for receiving an input digital signal and for generating an intermediate signal in response to each transition in the input signal. The intermediate signal commences at one of two preselected values and, upon detection of a transition in the input digital signal, increments or decrements towards the other of the values. Means are provided for generating a reference frequency, Means are provided for dividing the reference frequency by a divisor which is a function of the value of the intermediate signal. The output of the dividing means is adapted to form the input to a sinewave synthesizer.

The intermediate signal generating means comprises a transition detector, timing signal means, and counter means. The detector receives the input digital signal and generates a control signal for each detected transition. The counter means receives the timing signal and the control signals and is indexed from one of the limits to the other of the limits upon receipt of each control signal.

The counter means comprises a reversible pseudo random shift register. The receipt of each control signal causes the register to reverse direction. The counter generates a series of binary words upon the detection of each transition. The words are in sequence between the preselected values.

The dividing means comprises a memory addressable by the binary words and capable, in accordance with the address, of generating the divisor. The divisor comprises first and second integers. The integers are each represented by a four-bit binary word.

More specifically, the intermediate signal generating means comprises means for generating a first control signal for each detected transition of the first type (leading edge of pulse) and means for generating a second control signal for each detected transition of the second type (trailing edge of pulse). The reversible shift register is connected as an up/down counter. The first control signal causes the register to shift in one direction and the second control signal causes the register to shift in the opposite direction.

The dividing means comprises a read only memory (ROM) and a programmable dividing means. The ROM comprises a plurality of storage locations and means for addressing the storage locations in accordance with the output of the up/down shift register.

The ROM generates first and second binary word outputs, each representing an integer. The dividing means comprises counter means, means for applying one of the binary words to the data input of the counter means, and an overflow rate multiplier means. The multiplier means receives the other of the binary words and controls the indexing of the counter means in accordance therewith.

The multiplier means comprises latch means and adder means. The adder means comprises a plurality of full adder circuits. Each of the adders has a carry output and a sum output. Each of the carry outputs is operably connected to the input of the preceding full adder circuit. Each of the sum outputs is operably connected to a different input of the latch means circuits.

The output of the dividing means is a signal whose frequency varies in time in a manner which simulates a raised cosine waveform. This waveform is particularly useful in the modem application.

In accordance with another aspect of the present invention, apparatus is provided for band limiting FSK or PSK input signals. The apparatus comprises means for detecting each transition in the input signal and for generating a control signal coincident therewith. Means are provided for generating timing signals. Means are provided for counting the timing signals. The counting means is indexed between first and second preselected values in accordance with the control signals. Storage means are provided containing information relating to the sets of words representing divisors. The storage means is operably connected to be addressed by the output of the counting means and to generate first and second integers in accordance therewith. Divider means are provided which are operably connected to the storage means for receiving the integers and to divide a reference frequency thereby.

The dividing means preferably comprises a programmable divider The divider is programmable to divide the reference frequency by the words and take the average thereof to form the output.

In accordance with another aspect of the present invention, the apparatus is provided for converting a digital input comprising a pulse train into an output whose frequency is a function thereof. The apparatus includes means for detecting the leading and trailing edge of each pulse in the train and means for generating sets of numbers for each detected edge. The number sets vary between first and second limits and are directed in accordance with whether a leading or a trailing edge is detected. Means are provided for converting the number sets into an output whose frequency is a function of the numbers in the sets. The output frequency varies in a manner which simulates a portion of a raised cosine waveform.

The apparatus further comprises means for generating a reference frequency and means for dividing the reference frequency by divisions which are functions of the numbers in the sets.

To these and to such other objects which may hereinafter appear, the present invention relates to a digital circuit with band limiting characteristics, as described in the following specification and recited in the annexed claims, taken together with the accompanying drawings, wherein like numerals refer to like parts, and in which:

FIG. 1 is a block diagram of a conventional transmission section of a modem;

FIG. 2 is a block diagram showing the manner in which the digital circuit and divider circuit of the present invention may be connected in conjunction with a sinewave synthesizer to form the transmit section of a modem;

FIG. 3 is a block diagram of the digital circuit of the present invention;

Figure 4:
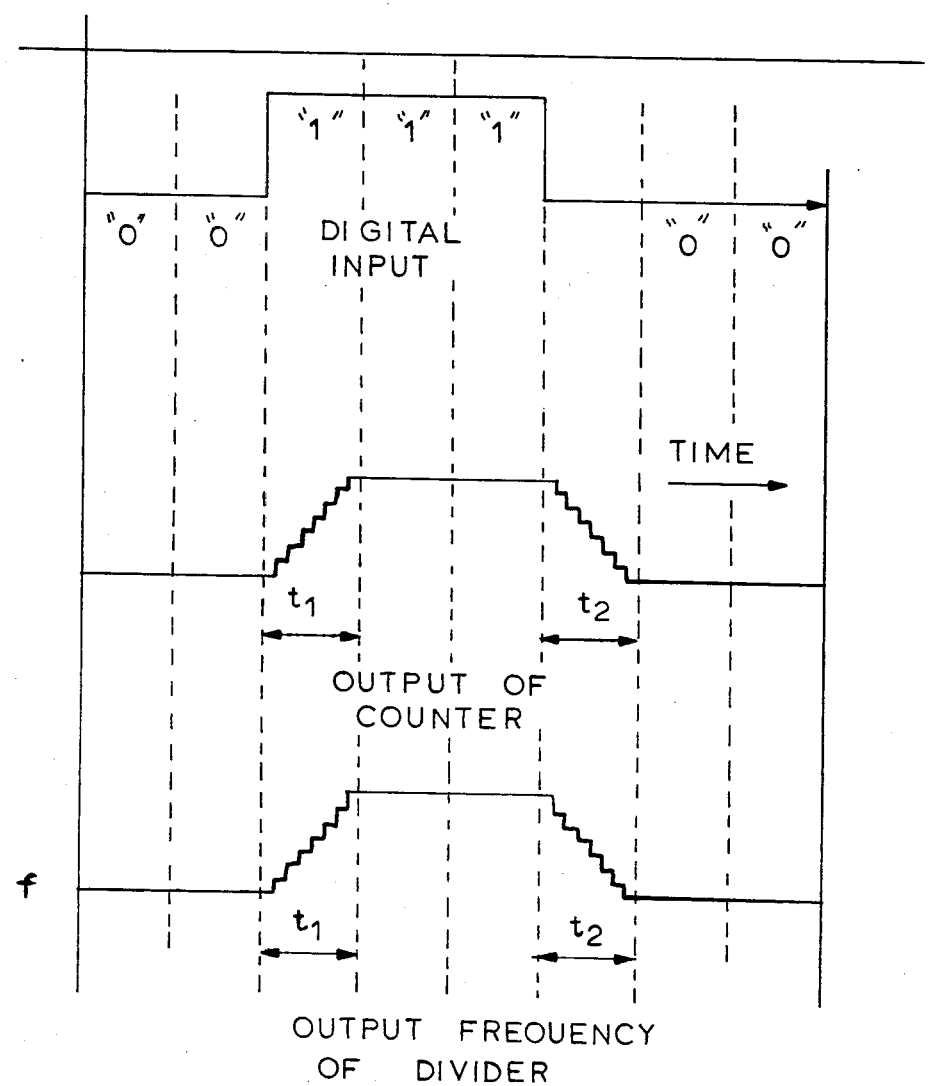
FIG. 4 is a graphical representation of the input digital signal, the output of the counter, and the output of the divider of the present invention.

The transmit section of a frequency shift keyed (FSK) modem receives an input from a digital component in the form of a digital signal representing a series of "ones" and "zeros" in a particular order. The modem converts the digital input signal into an output signal consisting of two different frequencies within a particular frequency range which are separated by a given frequency difference, for example, 200 Hz. One of the frequencies represents the "ones" of the digital input signal, the other represents the "zeros." The frequencies are generated by frequency modulating a carrier between the two frequencies.

To enable the modem to receive and transmit signals simultaneously, two carrier bands, each consisting of a pair of frequencies, are employed. In order to separate the two carrier bands, the transmit spectra must be confined such that it does not overlap the receive band.

Conventional modems achieve this result through the use of a band limiting filter. In particular, a band pass filter is employed at the output of the transmitter, as illustrated in FIG. 1. The digital input, consisting of "ones" and "zeros", forms the input to a voltage controlled oscillator 10. Oscillator 10 modulates the carrier to form an output signal consisting of the two frequencies (assuming the modulation rate between them was zero. In practice, the output signal consists of many frequencies when the modulation rate between the two frequencies is high). The output of the oscillator is applied to the input of a band pass filter 12 which permits only frequencies in the selected carrier band to be transmitted.

While this approach functions acceptably, it cannot be implemented on an integrated circuit chip because there is no easy way to fabricate close tolerance resistors or capacitors on a chip to obtain the stability of parameters necessary for the filter.

One way to overcome this problem is to replace the resistors or capacitors with voltage controlled devices such as MOS transistors. An oscillator is required whose frequency is controlled by the voltage controlled devices. The control voltage must be regulated such that the oscillator remains in phase lock with some reference frequency. This approach has not been adopted because of the problems of signal size and harmonic distortion produced by the voltage controlled devices.

Another technique is to utilize a switched capacitor filter technique wherein all resistors are replaced by capacitors which are charged and discharged repeatedly at a fixed rate approximating a sampled resistor. The switched capacitor technique requires the fabrication of low parasitic capacitors. Also, high slew-rate op-amps. Neither are possible with a simple CMOS process, nor is it easily programmable for many FSK standards.

We have, therefore, adopted a different approach for the modem. This approach employs digital signal processing and, thus, can be implemented on an integrated circuit chip at relatively moderate expense. In general, this technique employs a crystal oscillator from which all system clocks are derived, including a clock input to a programmable divider which is controlled to divide the input clock signal down to a frequency which is a given multiple of the desired output frequency. The output of the divider passes through a pre-scaler and then to a sinewave synthesizer consisting of a step control logic circuit and a ROM containing the values of a sinewave. The output of the synthesizer is converted into an analog signal in a digital-to-analog converter.

Thus, as illustrated in block form in FIG. 2, the present invention utilizes a digital circuit in the form of a band limit control logic circuit 14 and a programmable divider 15. These circuits operate on the digital input prior to applying it to the equivalent of a voltage controlled oscillator which may be realized digitally by a sinewave synthesizer 16 and a digital-to-analog converter 17.

The logic circuit 14 and programmable divider 15 are shown in FIG. 3 in more detailed block form. The logic circuit includes a transition detector circuit 18 which receives the digital input signal and generates a control signal to the input of an up/down counter 20 each time a transition is detected. Counter 20 receives a clock signal on line 22.

The parallel output of the up/down counter 20 forms the address input to a read only memory (ROM) 24 which provides two binary words representing integers N and M. These words function as inputs to the programmable divider 15. Divider 15 also receives a clock signal on line 28. The output of divider 15 is applied to the input of the sinewave synthesizer 16.

FIG. 4 graphically illustrates the principle of the invention. The top graph shows a typical digital input signal consisting of a pair of low states ("zero") followed by several high states ("one") which, in turn, are followed by a second pair of low states ("zero").

Counter 20 is allowed to increment or decrement from a first value (corresponding to one state of the digital input) towards another value (corresponding to the other state of the digital input) in steps following each detected transition, as shown in the middle graph. The counter is arranged so that once the count is initiated, it will count to the other stable state and then stop until the next transistor is detected. The frequency of the output of the programmable divider (FIG. 12, signals on output lines 130 and 132) varies as a function of the count on the counter, as illustrated on the bottom graph.

For example, after the digital input changes from "zero" to "one," the counter output increments from a low limit to a high limit. This causes the output frequency of divider 15, during time $t_1$, to change in increments, from a low value to a high value. The output frequency will stay at the high value until another transition in the digital input signal takes place. When the transition from "one" to "zero" is detected, the counter decrements, back to the low limit. This will cause the output frequency to change in increments back towards the low value. The frequency of the output signal of the divider will vary in a manner controlled by the contents of ROM 24 which, in the preferred embodiment, contains a raised cosine shape. However, the ROM may be programmed to provide other shapes, as required.

The output of counter 20 is used to address a store (ROM 24) which contains the information necessary to program divider 15. In the preferred embodiment, the output of the divider will have a frequency which varies in a manner which simulates a raised cosine configuration. The raised cosine is, however, only one arbitrary shape that may be stored in the ROM. Other shapes may be suitable for various applications.

Figure 8:
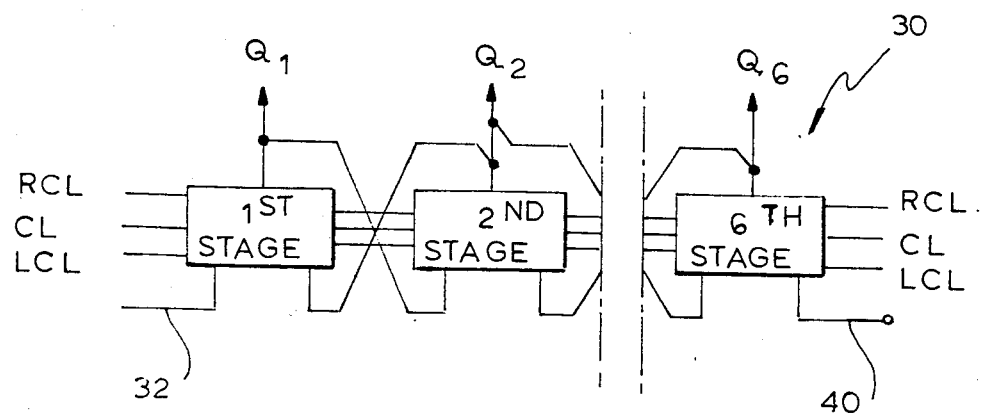
FIG. 8 is a block diagram of the shift register portion of the band limit control logic of the present invention.
Figure 5:
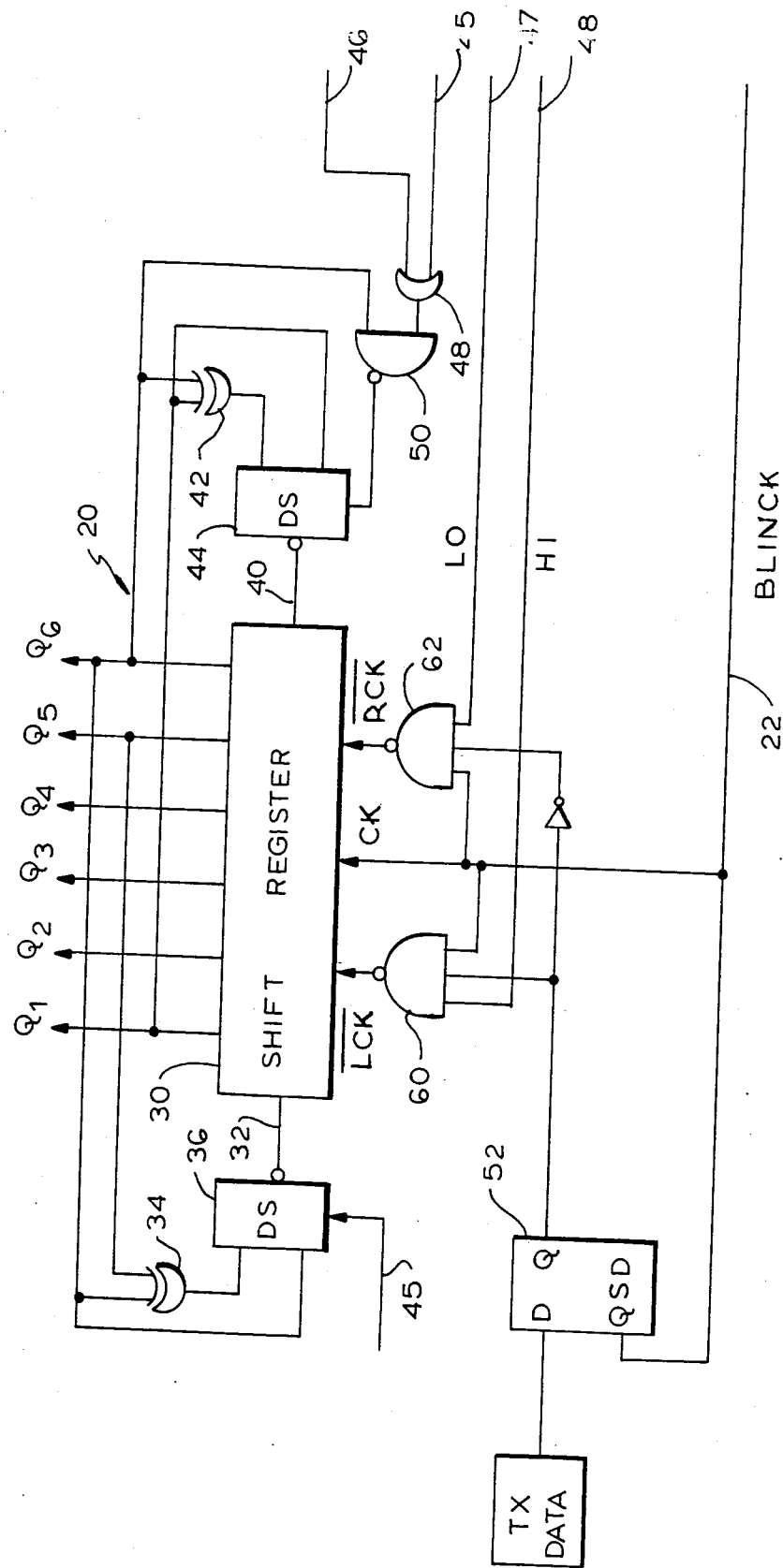
FIG. 5 is a schematic diagram of the band limit control logic of the present
Figure 6:
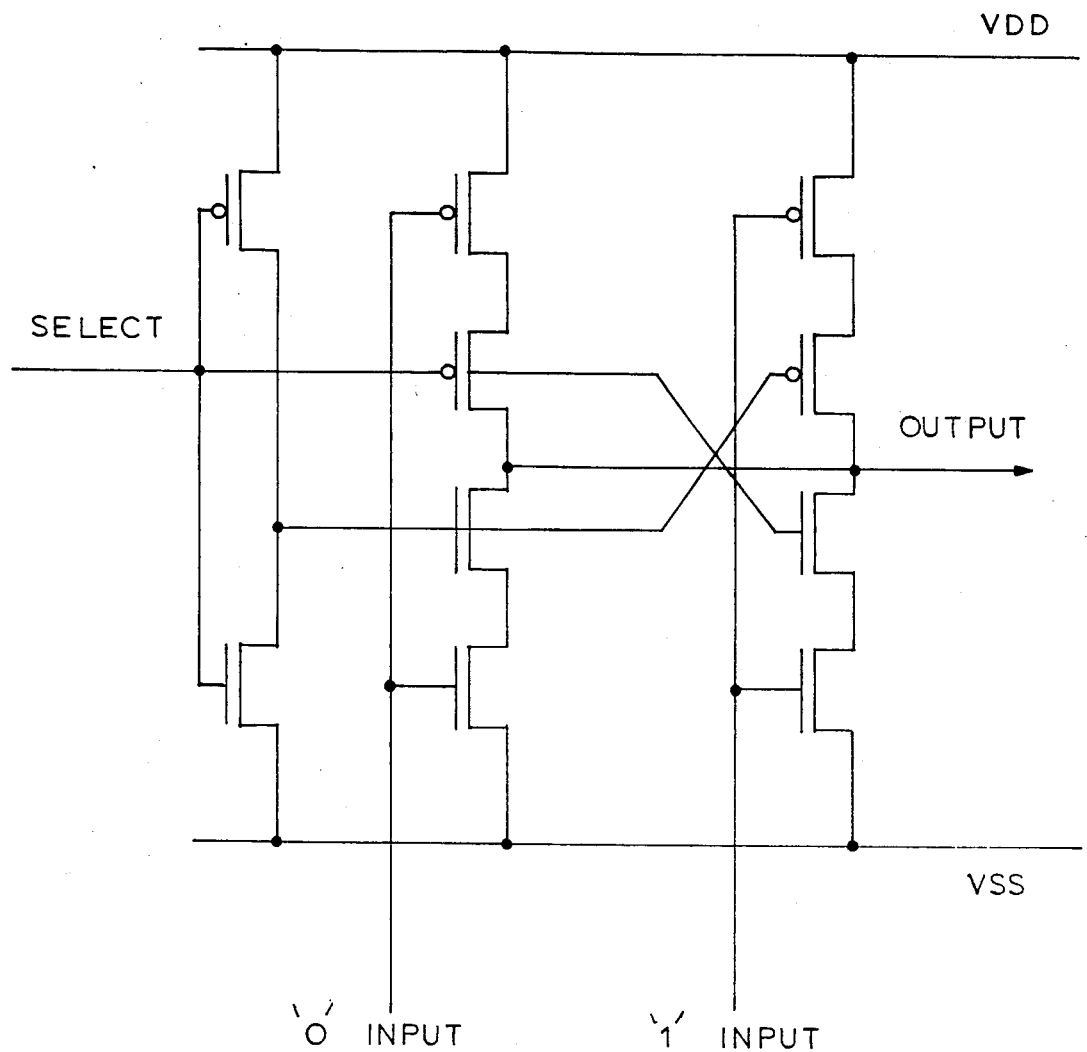
FIG. 6 is a schematic diagram for the data selector which forms a part of the band limit control logic.
Figure 7:
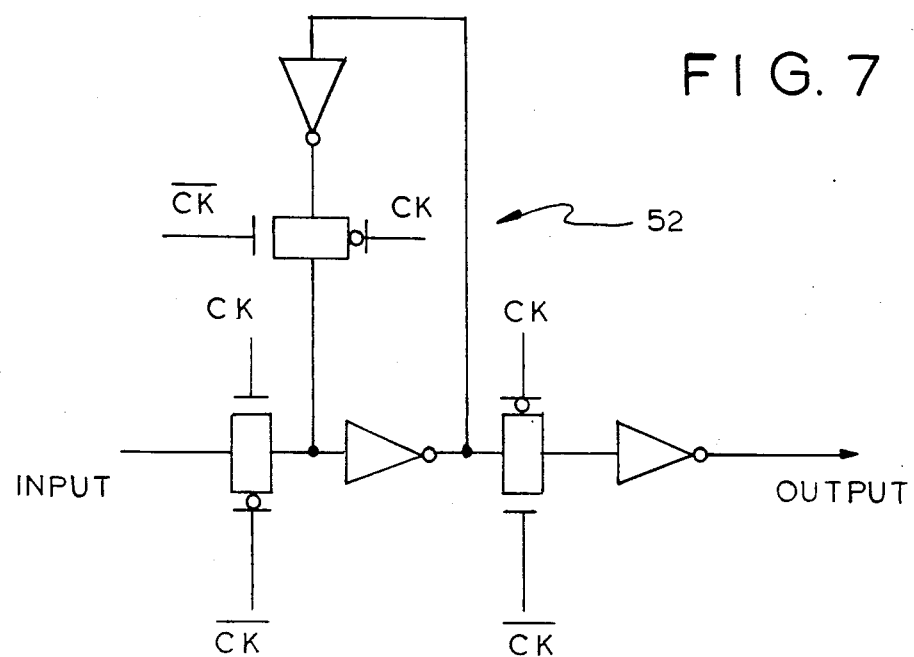
FIG. 7 is a schematic diagram for the quasi static dynamic flip-flop which forms a part of the band limit control logic.
Figure 9:
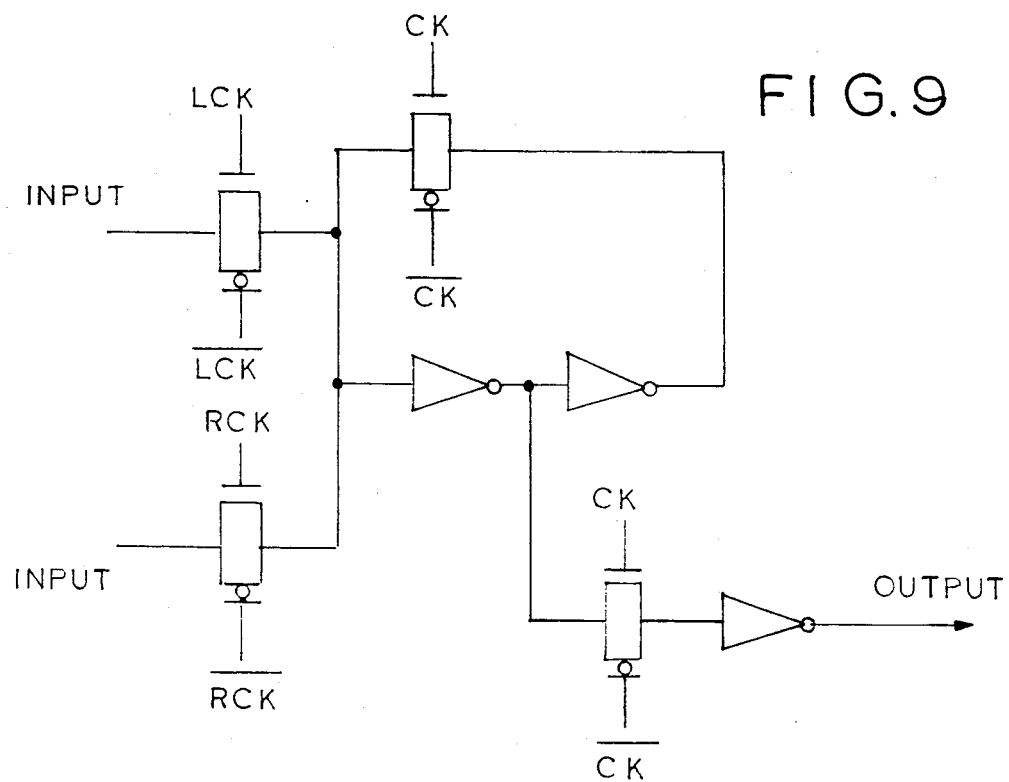
FIG. 9 is a schematic diagram of a typical cell in the shift register shown in FIG. 8.

Transition detector 18 and counter 20 are illustrated in FIGS. 5 through 9. Counter 20 consists of six bits of a quasi-static left/right shift register 30, illustrated in block form in FIG. 8. Register 30 is set up to function as a pseudo random counter. It receives three clock signals, right clock (RCL), clock (CL), and left clock (LCL) derived from the transition detector circuit 18 (shown below register 30 on FIG. 5) and from Hi and Lo signals generated by ROM 24. Each stage of the register is cross-coupled to the adjacent state and consists of bistable circuit, as shown in FIG. 8. Each stage receives the three clock signals, RCL, CL, and LCL and generates a separate output. The six outputs $Q_1 \ldots Q_6$ are fed to ROM 24. A typical stage of register 30 is schematically illustrated in FIG. 9.

When shifting right, the input at line 32 is the EXNOR of the fifth $Q_5$ and sixth $Q_6$ bits formed through EXORgate 34 and a data selector 36 which receives a select signal from ROM 24 on line 45. The structure of data selector 36 (and data selector 44) is illustrated schematically in FIG. 6. When this input becomes "true" (the output of the register is 1 1 1 1 1 0), the data selector 36 feeds the complement of $Q_6$ to the register input causing the register output to next go to 1 1 1 1 1 1, that is, high states. At 1 1 1 1 1 1, the input at line 45 is still true so the complement of $Q_6$ is still the input. The complement of $Q_6$ is now 0, causing the next count to be 0 1 1 1 1 1. This causes the input on line 45 to become "not true" and data selector 36 to input EXNOR $Q_5$ and $Q_6$ again.

When shifting left, the input at 40 is the EXNOR of outputs $Q_1$ and $Q_6$ formed through EXORgate 42 and data selector 44. The register will shift left with the EXNOR of $Q_6$ and $Q_1$ as its input until X 1 1 1 1 1 ("X" represents either "0" or "1") is decoded. This is represented by two select outputs from ROM 24, applied on line 45 and line 46, respectively, through gates 48 and 50.

The right clock sequence is the reverse of the left clock sequence. Thus, when changing from left to right or vice versa, the direction changes and the counter retraces its progress through the sequence.

Transition detector 18 controls the clocking direction. The digital signal to be transmitted (TX Data) forms the D input to a quasi-static dynamic (QSD) cell 52, schematically illustrated in FIG. 7. The other input of QSD cell 52 is a clock signal (BLINCK) on line 22 which is a divided clock signal. This signal controls the rate of change in frequency during a change in $T_x$ data.

The divided clock signal on line 22 provides one clock (CL) signal to register 30, as well as to one input of each of a pair of three input NORgates 60, 62. Another input to each NORgate 60, 62 is the Q output of QSD 52 and the complement thereof, respectively. The third input to each gate 60, 62 is generated by ROM 24 and is applied to lines 47 and 48. The signals on lines 47 and 48 are denoted as Lo and Hi, respectively. The $T_x$ Data signal controls the direction of clocking by inhibiting one NORgate 60, 62 and opening the other.

Figure 10:
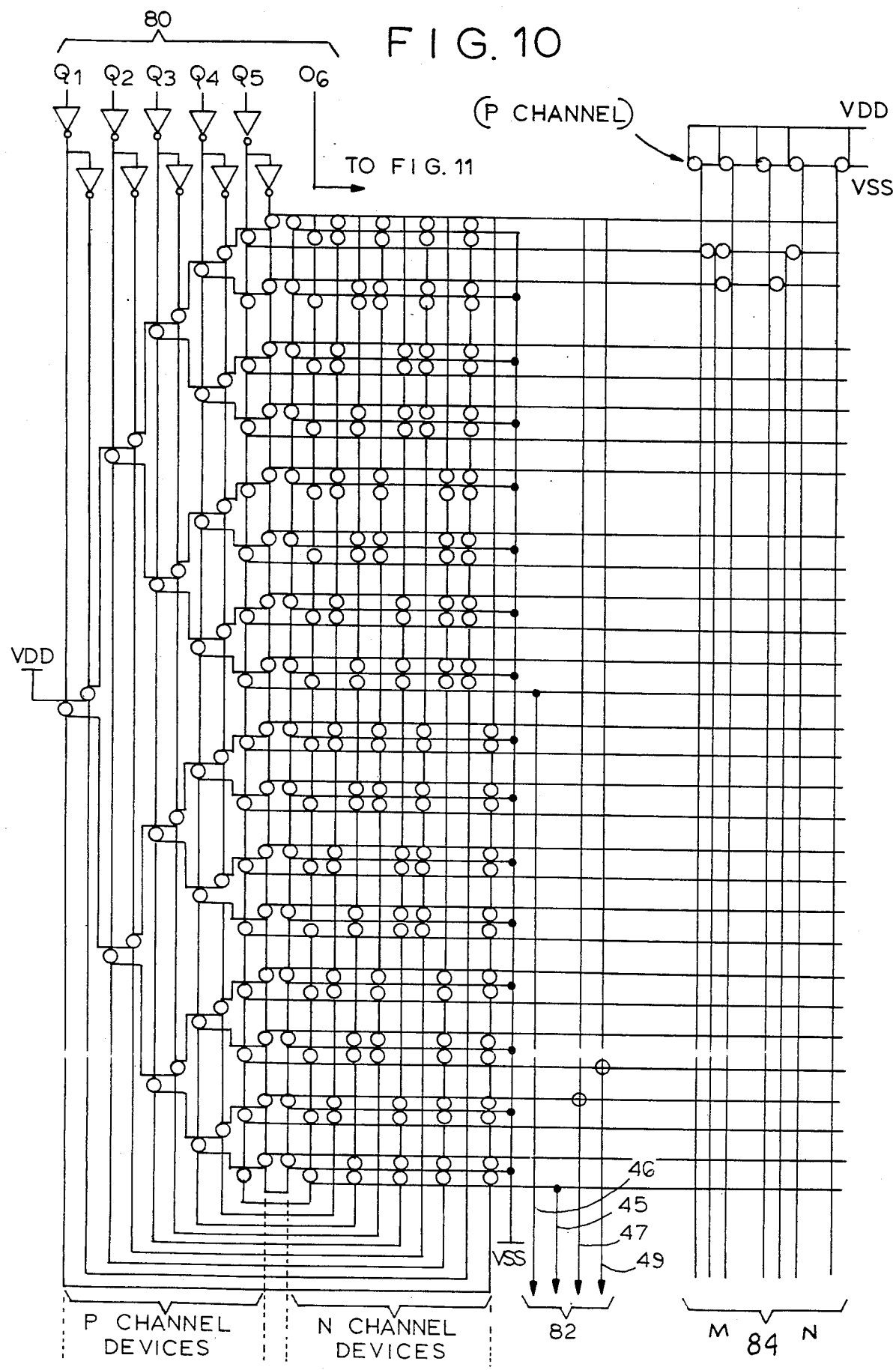
FIG. 10 is a schematic diagram of the read only memory of the present invention.
Figure 11:
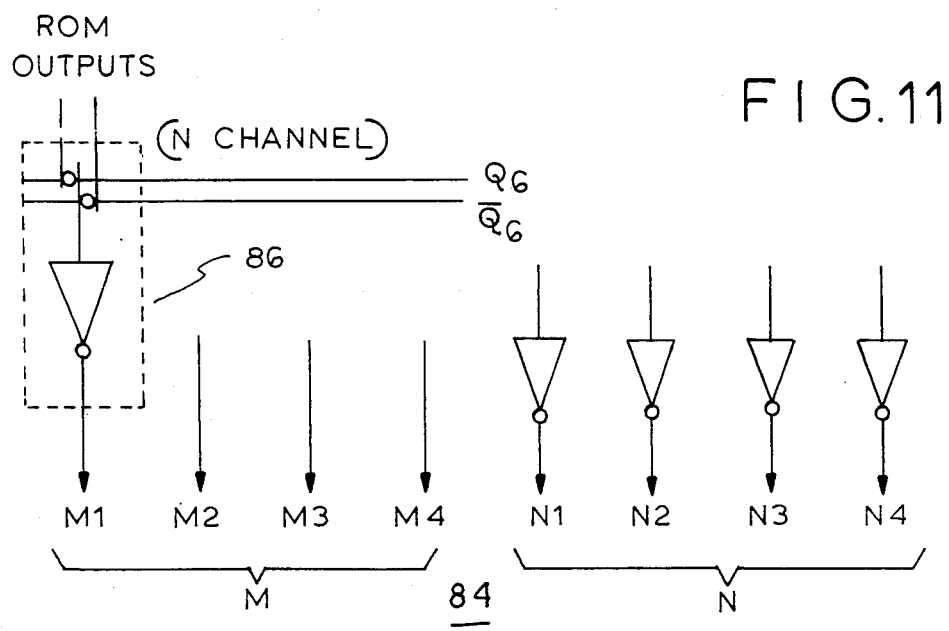
FIG. 11 is a schematic diagram of a typical portion of the output section of the read only memory of the present invention.

ROM 24, as shown on FIGS. 10 and 11, is a static CMOS ROM composed of P-channel and N-channel devices which form a matrix array of transistors, input lines 80, control output lines 45, 46, 47 and 48, and data output lines M and N. Input lines 80 consist of six lines receiving the six outputs of register 30 ($Q_1$, $Q_2$, $Q_3$, $Q_4$, $Q_5$ and $Q_6$) respectively. The control output lines consist of four lines which form control inputs to register 30 and the transition detector circuit 18 which form band limit control logic 14. These lines are the inputs to data selector 36 (line 45), gate 48 (lines 45 and 46), and the Lo and Hi inputs to gates 60 and 62 (lines 47 and 48).

Outputs 84 form the inputs to the circuit shown in FIG. 11 which, through a plurality of programmable devices 86 (only one of which is shown), provides four bit inputs M, N to divider 26. Each device 86 receives two outputs 84 and combines same with signals $Q_6$ and $\overline{Q_6}$ to form one bit of the binary words representing integers M and N, which, as explained in detail below, control the operation of the divider.

Figure 12:
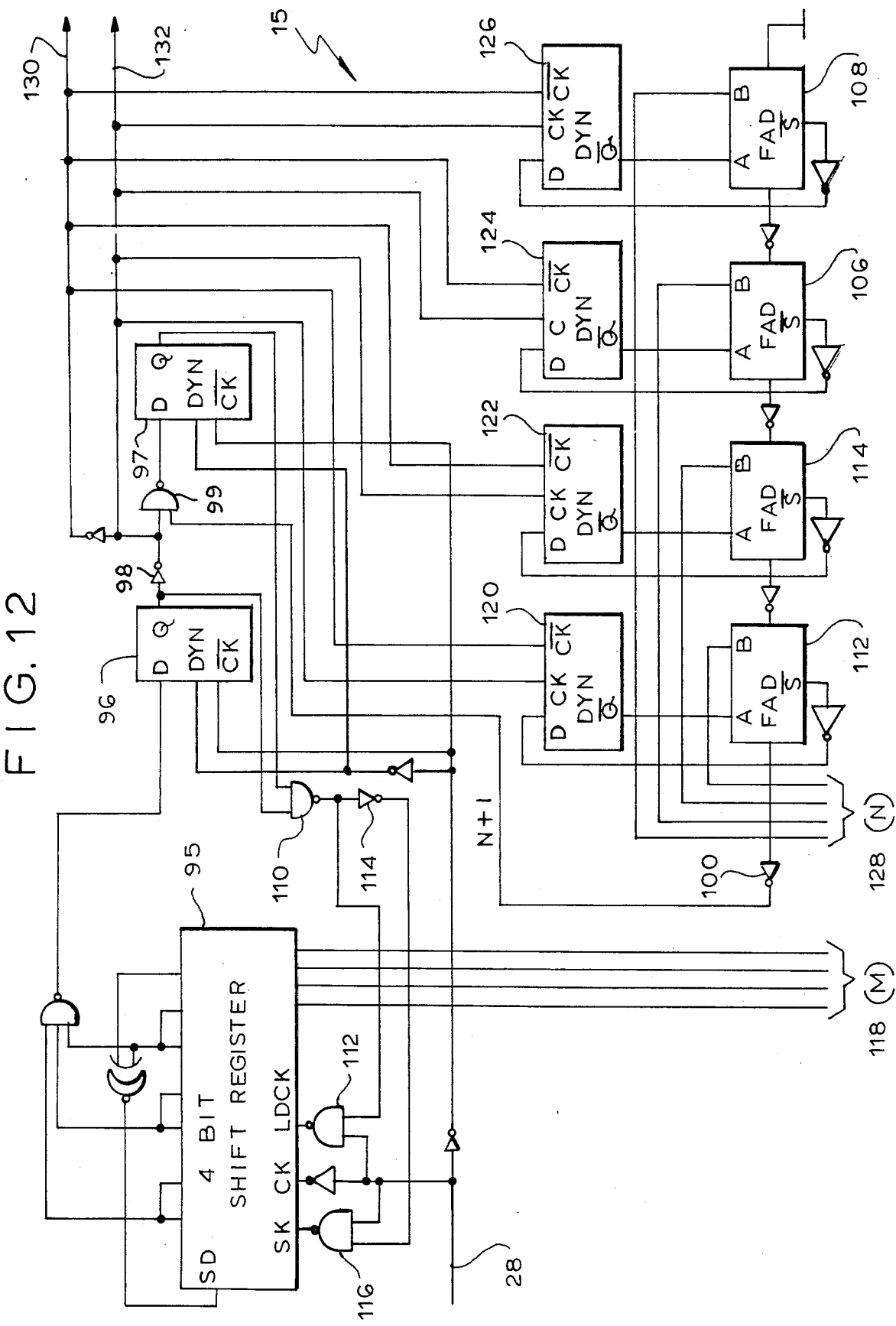
FIG. 12 is a schematic diagram of the programmable divider of the present invention including the overflow rate multiplier.

Divider 15 is illustrated in FIG. 12 and consists of a four-bit loadable pseudo random counter and an overflow rate multiplier. This circuit divides the basic chip clock (e.g. 2 mHz) to a frequency that is a given multiple (e.g. sixty-four times) the desired output frequency. This is necessary because the sinewave synthesizer divides the output of the multiplier by this multiple.

In order to obtain an output frequency within the necessary range, the output of the divider must be within 6 Hz or 1% of the desired frequency. This accuracy requires something more elaborate than an integer division. With integer division, to obtain all the required output frequencies, we would require to start with a very high frequency to allow a division long enough to get the necessary resolution.

In order to obtain the required accuracy, the divider is constructed to divide by $N+(M/16)$, where N is an integer represented by one four-bit word from the circuit of FIG. 11, and M another integer represented by another four-bit word from the circuit of FIG. 11. By selecting M and N appropriately, the desired division is performed. For example, if the required output frequency is 2225 Hz, it will be necessary to divide the basic chip clock frequency (2 mHz) by 14.04 to obtain a frequency which is 64 times the desired output frequency. By choosing N=14 and M=1, alternately dividing the basic chip clock by 14 and 15 and averaging the results, a division ratio of $14=(1/16)$ and an output of 2222.20 will be obtained, which has a 2.7 Hz error, well within acceptable limits.

Figure 13:
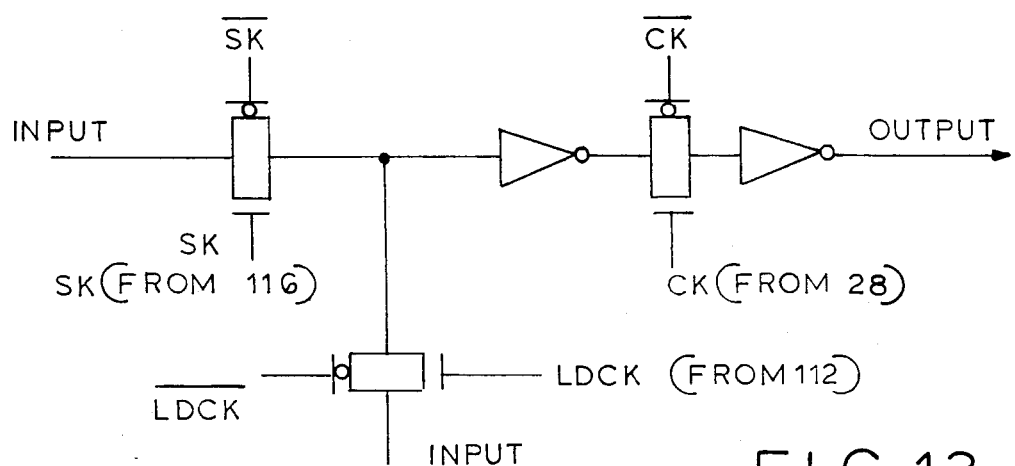
FIG. 13 is a schematic diagram of a typical cell of the left-right shift register of the divider.
Figure 14:
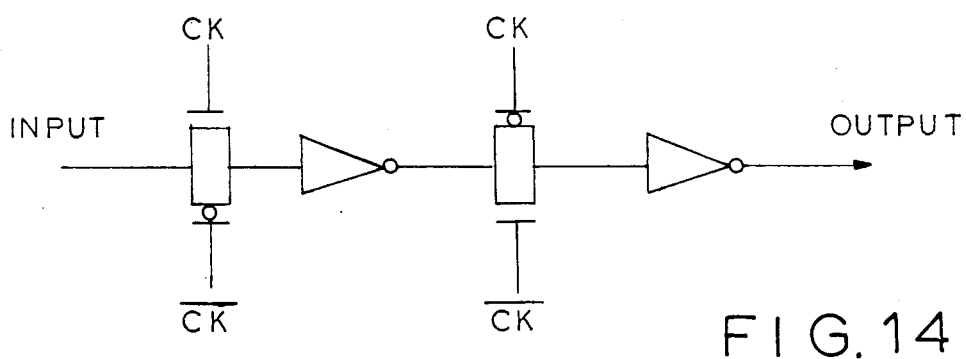
FIG. 14 is a schematic diagram of the dynamic D-type flip-flop of the divider.
Figure 15:
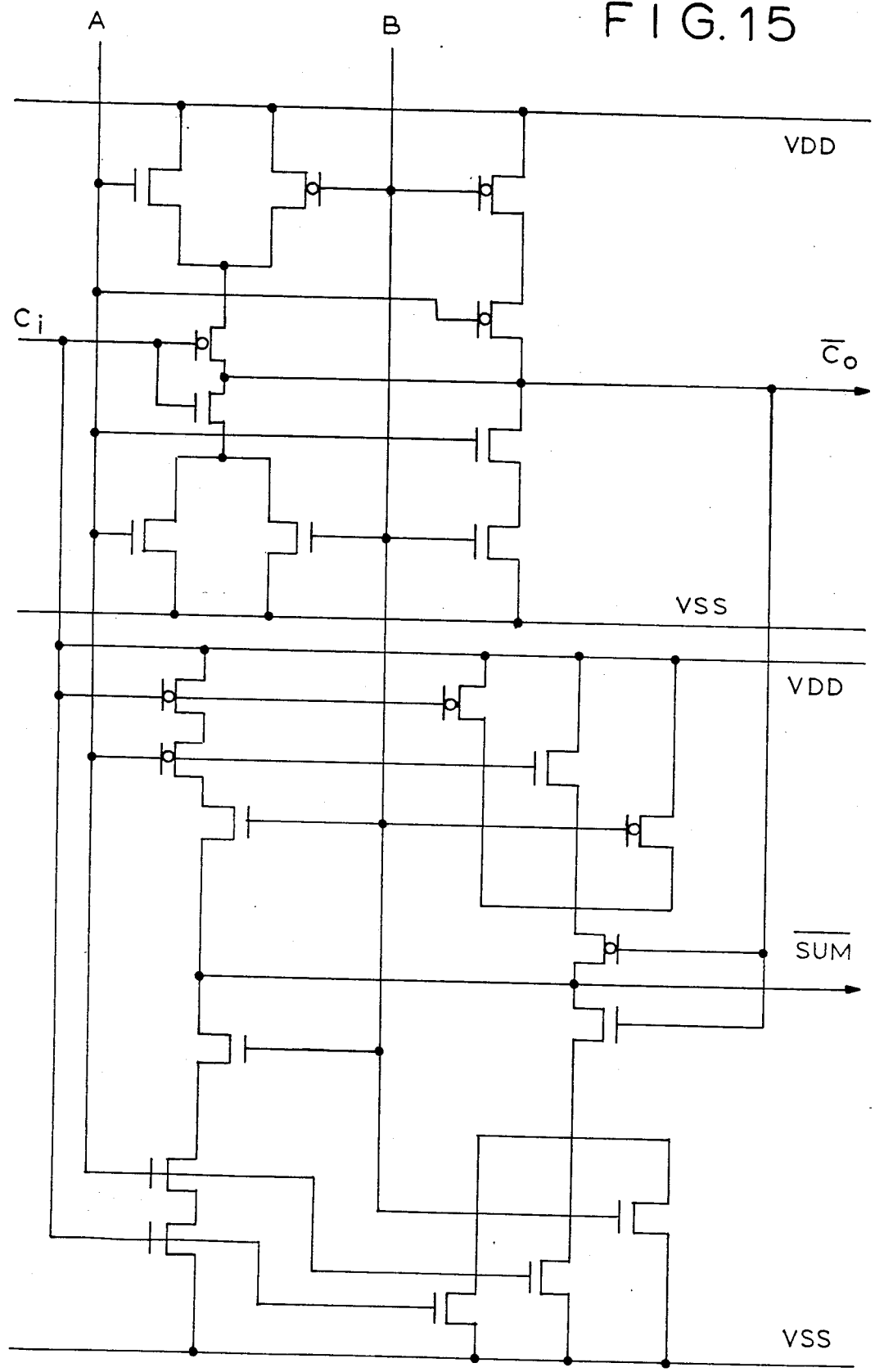
FIG. 15 is a schematic diagram of a typical full adder cell of the divider.

The circuit receives the basic chip clock signal on line 28. The clock signal is applied to the clock input of a four-bit shift register 95 and to the clock inputs of a pair of dynamic D-type cells 96, 97. The structure of a typical stage of register 95 is illustrated in FIG. 13. The structure of a typical dynamic D-type flip-flop cell (DYN) is illustrated in FIG. 14. The output of cell 96 is connected through an inverter 98 to one input of a gate 99, the output of which is connected to the D input of cell 97. This circuit forms a counter that divides by N or, when the input to gate 99 is high, N+1. The other input to gate 99 is received through an inverter 100 from one of four full adder circuits, 112, 114, 106, and 108 in the overflow rate multiplier. The structure of a typical full adder circuit is illustrated in FIG. 15.

The outputs of cells 96 and 97 form the inputs to gate 110. The output of gate 110 forms one of the inputs of a gate 112, the other input being the inverted clock signal from line 28. The output of gate 110 is inverted by inverter 114 and forms one input of a gate 116, the other input of which is the inverted clock signal from line 28. The clock signal and the outputs of gates 112 and 116 control the shifting of register 95.

The four-bit word which represents the integer M forms the data input to register 95. This word is applied to the register on four lines 118 which are connected to the outputs of the circuit of FIG. 11.

The register is set up as a four-bit loadable pseudo random counter. The state 111X ("X" represents either "0" or "1") is decoded and on the next clock signal DYN cell 96 is set. This gates in the value M instead of the next count in the pseudo random sequence. The fact that 111X is decoded means that the illegal state 1111 also generates a reset, thus insuring the counter always counts in the major loop. If the N+1 line (output of inverter 100) is high, DYN cell 97 is loaded as DYN cell 96 is reset. The outputs of cells 96 and 97 are ORed together by gate 110 and used to generate two consecutive load signals such that one extra state is added to the count.

An overflow rate multiplier is included as a part of the circuit shown on FIG. 12. This multiplier includes a four-bit latch comprising four DYN cells 120, 122, 124, and 126 and the four full adder cells 112, 114, 106, and 108.

Each of the full adder cells has two data inputs, one connected to the output of the aligned DYN cell of the latch and the other received on one of the four lines 128 which contain the four-bit word representing the integer N received from the outputs of the circuit of FIG. 11.

The $\overline{SUM}$ output of each adder is connected to the data input of each aligned DYN cell of the latch. The carry output of each adder is connected to the carry input input of the adjacent cell. The carry output $C_o$ of the last cell is connected to gate 99 via inverter 100. The clock inputs (CK and $\overline{CK}$) of the DYN cells 120, 122, 124, and 126 are connected to output lines 130, 132.

At each clock signal (generated by the output cell 96) a binary four-bit word representing integer N (on line 128) is added to the register. The final carry output is the N+1 signal which passes through inverter 100 to the input of gate 99. Register 95 spaces M pulses evenly over the complete cycle of the input clocks. Any odd M will produce a repetitive pattern sixteen clocks long. Even M's produce shorter patterns. One of the desirable features of this circuit is that M can be changed in the middle of a sixteen-bit pattern without causing a discontinuity in the average division.

In order to encompass the range of divisions without making M or N too long, a three-bit pre-scaler (not shown) may be used between divider 15 and the sinewave synthesizer. Restricting the N and M word lengths reduces the amount of logic running at the system clock rate and, thus, keeps power consumption down.

The pre-scaler may comprise a simple three-bit asynchronous ripple counter which receives inputs from output lines 130 and 132, as well as an additional two-bit word which causes the selection of divisions of 1, 2, 4, or 8. Accordingly, the whole division chain is programmed with a ten-bit word, four bits for M, four bits for N, and two bits to select the pre-scaler division.

When the present invention is used in a modem, the output of the pre-scaler, which is sixty-four times the desired output frequency, forms the input for a sinewave synthesizer which includes a sinewave step control circuit, a sinewave ROM, as well as a digital-to-analog converter and an output filter. These components are conventional, forming no part of the present invention and are not, therefore, described in detail herein.

In general, the sinewave step control circuit includes a left/right shift register, for example, having 14 bits, the outputs of which form the address inputs of a sinewave ROM. The output of the ROM is a word having, for example, six bits, which forms the inputs to a digital-to-analog converter. The output of the converter passes through an output filter. The filter is a real time filter composed of an operational amplifier. The output of the amplifier forms the signal to be transmitted and is applied to the telephone line.

It will now be appreciated that the present invention relates to a band limiting circuit which can be implemented digitally using known circuit fabrication techniques. It is particularly useful for generating transmit signals in a modem and can provide the necessary band limiting of the transmit signal without the necessity for band pass filters. This is accomplished through the use of a counter which is incremented or decremented upon each transition of the input digital signal, such that the output frequency is varied as an arbitrary shape, preferably a raised cosine. The output addresses a ROM which, in turn, controls a programmable divider. The output of the divider can be employed to clock a sinewave synthesizer to generate the transmit signals.

While only a single embodiment of the present invention has been disclosed herein for purposes of illustration, it is obvious that many variations and modifications could be made thereto. It is intended to cover all of these variations and modifications which fall within the scope of the present invention as defined by the following claims:

We claim:

1. A circuit for generating an output whose frequency is a function of an input digital signal comprising means for receiving the input digital signal and for generating an intermediate signal in response to each transition in said input digital signal, said intermediate signal commencing at one of two preselected values and, upon detection of each transition in said input digital signal, incrementing or decrementing towards the other of said values, means for generating a reference frequency, means for dividing said reference frequency by a divisor which is a function of the value of said intermediate signal, the output of said dividing means having a frequency which is a function of the input digital signal, said intermediate signal generating means comprising means for generating a first control signal upon detection of a leading edge transition in said input digital signal and means for generating a second control signal upon detection of a trailing edge transition in said input digital signal, a reversible shift register connected as an up/down counter and wherein said first control signal causes said reversible shift register to shift in one direction and said second control signal causes said reversible shift register to shift in an opposite direction, said dividing means comprising memory means comprising a plurality of storage locations and means for addressing said storage locations in accordance with an output of said reversible shift register, said memory means generating first and second words, each of said words representing an integer, said dividing means further comprising counter means, counter control means, said counter control means receiving said reference frequency and controlling the count of said counter means in accordance therewith, means for applying one of said words to the data input of said counter means, overflow rate multiplier means, said overflow rate multiplier means receiving said other of said words and controlling said counter control means in accordance therewith, said overflow rate multiplier means comprising latch and full adder means.

2. The circuit of claim 1, wherein said intermediate signal generating means comprises a transition detector, timing signal means, and counter means, said transition detector receiving said input digital signal and generating a control signal for each detected transition, said counter means receiving said timing signals and said control signals and counting from one of said values to the other of said values upon receipt of each control signal.

3. The circuit of claim 2, wherein said counter means generates a series of binary words representing quantities between said values upon the detection of each transition.

4. The circuit of claim 3, wherein said dividing means comprises a memory addressable by said binary words and capable, in accordance with the address, of generating said divisor.

5. The circuit of claim 2, wherein said counter means comprises a reversible pseudo random shift register and wherein the receipt of each control signal causes said register to count in the opposite direction.

6. The circuit of claim 1, wherein said divisor comprises first and second integers.

7. The circuit of claim 6, wherein said integers each comprises a four-bit binary word.

8. The circuit of claim 1, wherein said full adder means comprises a plurality of full adder circuits and wherein each of said full adder circuits has a carry output and a sum output, each of said carry outputs being operably connected to an input of an adjacent full adder circuit and each of said sum outputs being operably connected to different input of said latch means.

9. The circuit of claim 1, wherein the frequency of the output, when plotted against time, substantially comprises a portion of a raised cosine waveform.

10. Apparatus for band limiting FSK or PSK input signals comprising means for detecting each transition in the input signal and for generating a control signal coincident therewith, means for generating timing signals, means for counting said timing signals, said counting means counting in different directions between first and second preselected values in accordance with said control signals, storage means containing information relating to possible divisors, said storage means being operatively connected to be addressed by the output of said counting means and to generate a divisor in accordance therewith, means for generating a reference frequency, divider means operatively connected to said storage means to receive said divisor and divide said reference frequency thereby, said divisor comprising first and second words, said divider means comprising means programmable to divide said reference frequency by each of said first and second words and to take the average thereof, said divider means comprising a loadable psuedo random counter, a counter control circuit connected to said pseudo random counter and overflow rate multiplier means operably connected to said counter control circuit.

* * * * *